(12) United States Patent
Lung

(10) Patent No.: US 7,364,935 B2
(45) Date of Patent: Apr. 29, 2008

(54) COMMON WORD LINE EDGE CONTACT PHASE-CHANGE MEMORY

(75) Inventor: Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 110 days.

(21) Appl. No.: 10/977,262

(22) Filed: Oct. 29, 2004

(65) Prior Publication Data
US 2006/0094154 A1   May 4, 2006

(51) Int. Cl.
*H01L 21/44* (2006.01)
(52) U.S. Cl. .................. 438/69; 438/674; 257/E21.536
(58) Field of Classification Search ................ 438/584, 438/597, 652, 666, 669, 674
See application file for complete search history.

(56) References Cited
U.S. PATENT DOCUMENTS

| | | | |
|---|---|---|---|
| 6,031,287 A | 2/2000 | Harshfield | |
| 6,111,264 A | 8/2000 | Wolstenholme et al. | |
| 6,114,713 A | 9/2000 | Zahorik | |
| 6,189,582 B1 | 2/2001 | Reinberg et al. | |
| 6,507,061 B1 * | 1/2003 | Hudgens et al. | ............ 257/295 |
| 6,514,788 B2 | 2/2003 | Quinn | |
| 6,569,705 B2 * | 5/2003 | Chiang et al. | ................ 438/95 |
| 6,597,009 B2 | 7/2003 | Wicker | |

\* cited by examiner

*Primary Examiner*—Scott B. Geyer
(74) *Attorney, Agent, or Firm*—Stout, Uxa, Buyan & Mullins, LLP

(57) ABSTRACT

A method of fabricating a phase-change memory cell is described. The cross-sectional area of a contact with a phase-change memory element within the cell is controlled by a first dimension of a bottom electrode and a second dimension controlled by an etch process. The contact area is a product of the first dimension and the second dimension. The method allows the formation of very small phase-change memory cells.

14 Claims, 17 Drawing Sheets

US 7,364,935 B2

COMMON WORD LINE EDGE CONTACT PHASE-CHANGE MEMORY

BACKGROUND OF THE INVENTION

1. Field of the Invention

The present invention relates generally to semiconductor fabrication methods and, more particularly, to fabrication of a phase-change memory cell.

2. Description of Related Art

Electrically writable and erasable phase-change materials have traditionally been used for memory devices. Phase-change materials, which may be formed of chalcogenide materials, can be electrically switched between two structural states of generally crystalline and generally amorphous local order. The generally crystalline state is a phase in which the material's atoms and/or electrons form a repeatable lattice structure, whereas the atoms and/or electrons of the generally amorphous state are randomly distributed. The structural state can also be switched among a range of detectable structural states of local order between the extremes of completely crystalline and completely amorphous states.

Currently favored chalcogenide materials that are used for phase change memory applications typically contain mixtures of Te, Se, Ge, Sb, Bi, Pb, Sn, As, S, Si, P, and/or O. Because of the range of structural states, a given as-deposited stoichiometric chalcogenide material can have varied bulk conductivities. Generally speaking, the more crystalline local order the state has, the higher the conductivity of the material. Moreover, the conductivity of the material can be selectively and repeatably established via an electrical pulse of given voltage and duration, herein called a setting or resetting voltage. The conductivity remains stable until another setting or resetting voltage of comparable size is applied. Furthermore, the conductivity of the material appears to vary inversely with the setting or resetting voltage and does not depend upon the previous state of the material, i.e., the material lacks hysteresis.

The aforementioned materials can be used to store and retrieve information within a non-volatile, overwritable memory cell. When different setting or resetting voltages are employed to change the conductivity of the material, the corresponding conductivities can be distinguished by various means including, but not limited to, the application of a relatively smaller voltage across the material within the cell. If, for example, two distinct setting or resetting voltages are used, one memory cell is able to store and retrieve one bit of binary encoded data. If more than two distinct setting or resetting voltages are used, then one memory cell is able to store and retrieve an analog form that can represent multiple bits of binary encoded data. Since the chalcogenide materials are able to maintain their respective conductivities, the memory cells are non-volatile, in that no refreshes are necessary to keep the data stored. The memory cells can also be directly overwritten, meaning that no data erasures are necessary prior to storing new data within the cells.

It is known that chalcogenide phase-change memory is not easy to incorporate into a CMOS circuit because the chalcogenide material requires a relatively high current density to change its state. Reducing the cross-sectional area of the chalcogenide part can reduce the current requirement in direct proportion. Structures which have been developed and which reduce this cross-sectional area involve fabricating ultra small contacts and depositing the chalcogenide into the contacts. One of the methods of fabricating ultra small contacts involves using a dielectric film, i.e., a spacer, to further reduce the photolithographic limit as referenced in U.S. Pat. No. 6,111,264. This technique can reduce the cross-sectional area, but the shrinking ratio is limited by the spacer thickness. For example, if the pore diameter is 1600 Å and the spacer thickness is 400 Å, the shrinkage area ratio is only about 4:1. The minimum pore diameter is determined by the photolithography and the spacer thickness. The shrinkage ratio can be limited. Thus, it can be difficult to scale down the chalcogenide parts in this fashion. If the chalcogenide parts cannot be scaled down, then relatively large current is required to cause a state change in the material. A requirement for larger current corresponds to a requirement for greater power to operate an array of such memory cells. There can be additional problems once the pores are scaled down. For instance, the uniformity of the pore-to-pore diameters can be poor. Moreover, the small pores can place constraints on the chalcogenide deposition process since it will be more difficult to deposit materials into the tiny openings. For example, in the context of pores formed using the process of the preceding paragraph, overhang of the spacer may partially or fully occlude the pore, further compromising the reliability of the deposition procedure. If the bottoms of the pores receive poor bottom coverage, the electrodes beneath them may not be able to predictably change the phases of the chalcogenide parts. If the phases are not repeatable when a given current is applied, the memory cell cannot reliably store data. Another critical issue arises in aligning phase-change material with a contacting electrode. Because of the large current densities involved, even relatively small misalignments can create large changes in current density that may adversely affect the ability to program phase-change memory cells.

A need thus exists in the prior art for a method of aligning a contacting electrode with a phase-change memory element. A further need exists for a method of fabricating an electrode for making contact with chalcogenide material using a relatively small cross-sectional area.

SUMMARY OF THE INVENTION

The present invention addresses these needs by providing a method of forming a memory cell having a contact between a bottom electrode and phase-change material, the area of the contact being a product of a first dimension and a second dimension. According to an implementation of the method, the bottom electrode is formed above a substrate, the bottom electrode having the first dimension. The bottom electrode may be covered with insulating material, and a portion of the insulating material removed to expose a portion of the bottom electrode, the exposed portion having the second dimension. A layer of phase-change material, which may be a chalcogenide material, can be disposed beside the exposed portion of the bottom electrode to form a contact between the phase-change material and the bottom electrode. The area of the contact is equal to the product of the first dimension and the second dimension. The first dimension, according to an exemplary implementation of the method, is substantially equal to a thickness of a film of conducting material that is deposited to form the bottom electrode. An etch process, the parameters of which can be very precisely controlled, determines the second dimension. The cross-sectional area produced by this implementation of the method can be substantially smaller than $4F^2$, where F is a smallest dimension that can be provided by a selected integrated circuit fabrication technology.

Another implementation of the method forms a bottom electrode by depositing a film of conducting material and then removing a portion of the conducting material. Conducting material not removed can have a width substantially equal to the first dimension. The second dimension may be determined by an etch process as already mentioned. A cross-sectional area of a contact formed by this implementation of the method can be substantially smaller than $4F^2$.

An embodiment of the present invention comprises a memory cell including a bit line disposed within a substrate, an isolation device formed above and making contact with the bit line, and a bottom electrode formed above the isolation device. The bottom electrode may have a first dimension. A phase-change material may be disposed beside the bottom electrode such that a contact between the bottom electrode and the phase-change material has a cross-sectional area equal to a product of the first dimension and a second dimension.

While the apparatus and method has or will be described for the sake of grammatical fluidity with functional explanations, it is to be expressly understood that the claims, unless expressly formulated under 35 U.S.C. 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. 112 are to be accorded full statutory equivalents under 35 U.S.C. 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1:
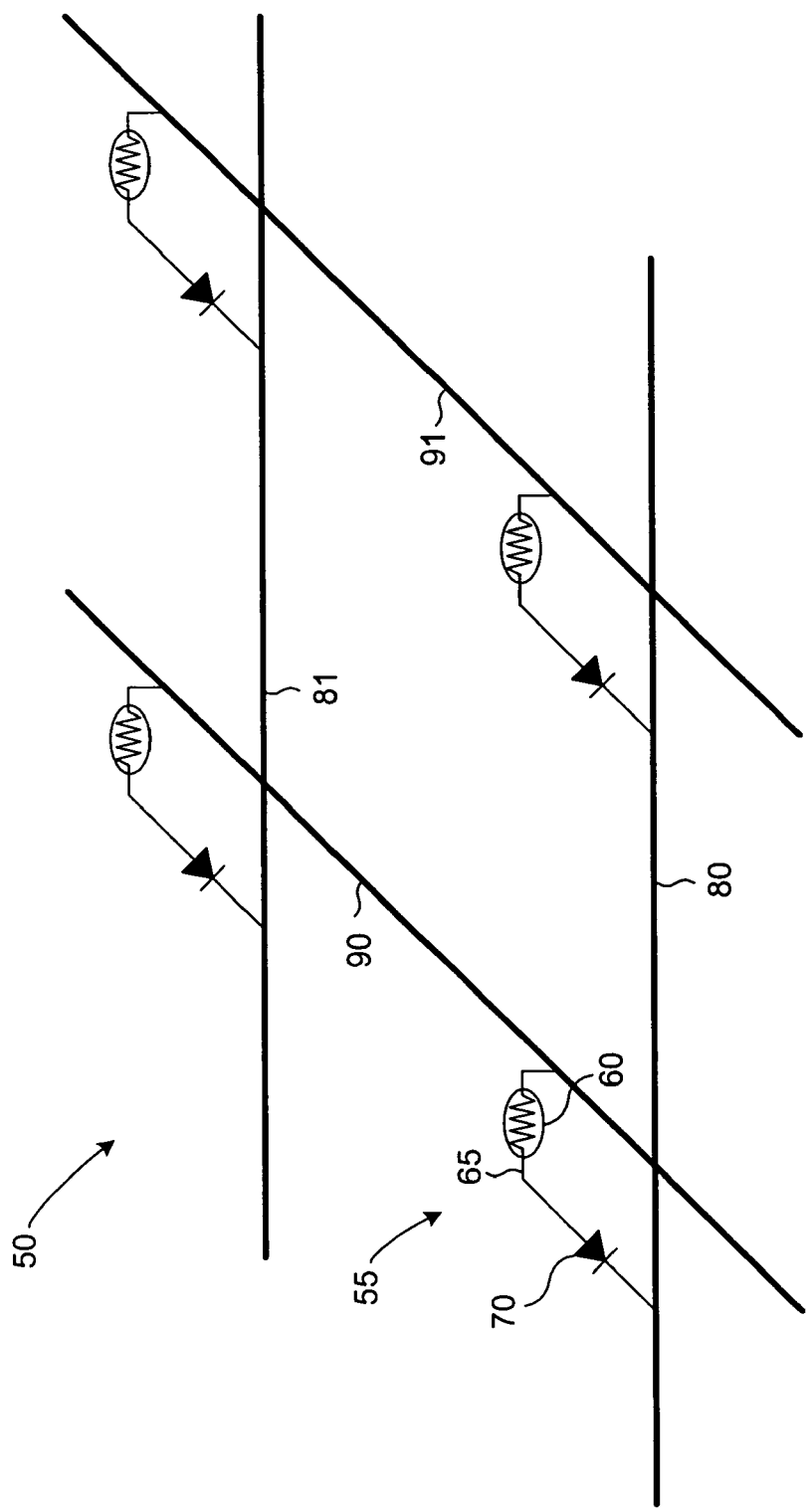
FIG. 1 is a schematic diagram of a portion of an embodiment of an array of phase-change memory cells fabricated in accordance with the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of chalcogenide memory structures. The present invention may be practiced in conjunction with various integrated circuit fabrication techniques that are conventionally used in the art, and only so much of the commonly practiced process steps are included herein as are necessary to provide an understanding of the present invention.

Referring more particularly to the drawings, FIG. 1 is a schematic diagram of a portion of an embodiment of an array 50 of phase-change memory cells. An illustrated phase-change memory cell 55 comprises a phase-change memory element 60 electrically connected to a word line 90. The phase-change memory element 60 may be formed of chalcogenide material. An isolation device 70 in the illustrated embodiment connects the phase-change memory element 60 to a bit line 80 through a bottom electrode 65. Although FIG. 1 illustrates four phase-change memory cells for simplicity, a typical array may comprise thousands of such cells. Two bit lines 80 and 81 and two word lines 90 and 91 are shown in FIG. 1. Again, typical phase-change memory arrays may comprise large numbers of bit and word lines that connect to control circuitry capable of applying setting and resetting voltages to phase-change memory cells. For example, to operate phase-change memory cell 55, a setting or resetting potential may be applied between word line 90 and bit line 80, phase-change memory cell 55 being located at the intersection of word line 90 and bit line 80.

Figure 2:
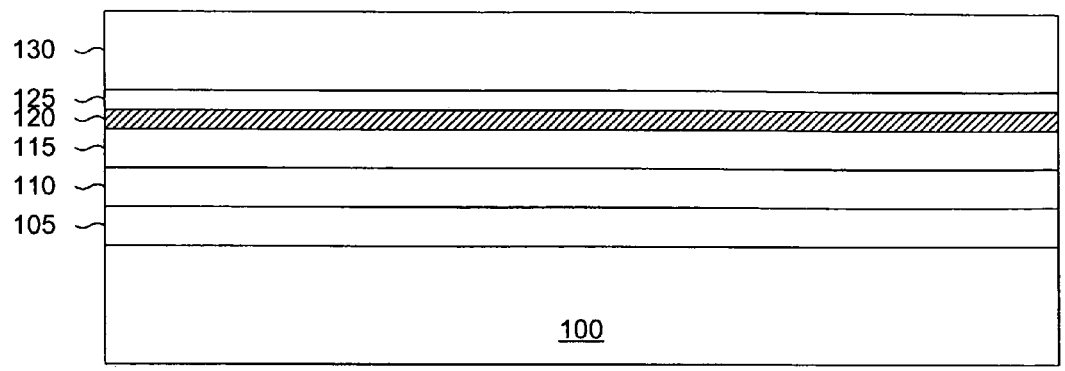
FIGS. 2–20 are cross-sectional diagrams illustrating results of processing steps of an implementation of a method of fabricating a phase-change memory cell according to the present invention.

FIG. 2 is a cross-sectional diagram that illustrates processing layers associated with the fabrication of an embodiment of a phase-change memory cell. Although reference is made in the text to a single phase-change memory cell, the diagrams to follow illustrate a plurality of phase-change memory cells formed on a single substrate. The method herein disclosed may apply to the formation of a relatively large number of such phase-change memory cells on one or more substrates.

According to a typical embodiment, fabrication of a phase-change memory cell comprises forming several doped layers on a P-type substrate 100 using methods well known in the art. The P-type substrate 100 may be formed of silicon doped with, for example, about $10^{11}$–$10^{13}$ atoms of boron per cubic centimeter. An N+ layer 105 comprising silicon doped with, for example, about $10^{14}$–$10^{16}$ atoms of phosphorous or arsenic per cubic centimeter may be formed above the P-type substrate 100. In the illustrated embodiment, an N− layer 110 formed of silicon doped with, for example, about $10^{12}$–$10^{14}$ dopant atoms per cubic centimeter overlies the N+ layer 105. A P+ layer 115, formed by doping intrinsic silicon to a concentration of about $10^{14}$–$10^{16}$ dopant atoms per cubic centimeter, overlies the N− layer 110. According to a representative embodiment of the phase-change memory cell, the N+ layer 105 is used to form a bit line, and the P+/N– layers 115/110 form a PN diode that functions as an isolation device 70 as introduced in FIG. 1. These details are more fully described in that which follows.

A silicide layer 120 formed, for example, of tungsten silicide, cobalt silicide, or titanium silicide, overlies the P+ layer 115, and a buffer layer 125 is formed over the silicide layer 120. The buffer layer 125 may comprise a layer of insulating material formed of, for example, silicon dioxide. A silicon nitride layer 130 overlies the buffer layer 125.

Figure 3:
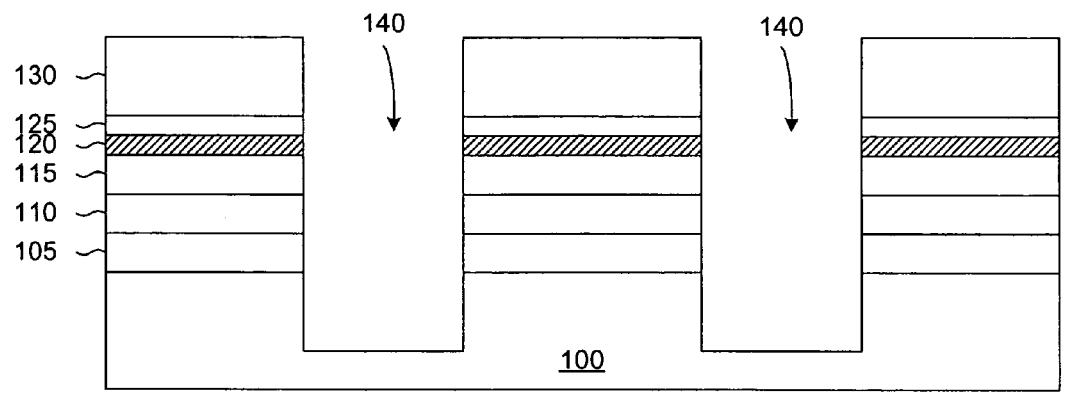

FIG. 3 is a cross-sectional view of a result of forming trenches 140 in the layered structure described in FIG. 2. The trenches 140 begin to isolate bit lines oriented perpendicular to the plane of the page (i.e. into the diagram) as is more fully described below with reference to FIG. 10. The trenches 140 may be formed by coating an upper surface of the layered structure with a photoresist material and patterning the photoresist layer using a photolithographic process. The materials that form the layered structure may then be etched according to the photoresist pattern. The etch operation may include, for example, multiple etching processes performed in sequence. For example, a first etch process may be a selective etch process (e.g., a dry plasma etch process) in which the etchant has a higher selectivity for nitride than for oxide. The first etch process may remove material in the silicon nitride layer 130. A second etch process may be a selective etch process (e.g., a dry plasma etch process) in which the etchant has a higher selectivity for oxide than for silicide. The second etch process may remove material in the buffer layer 125. A third etch process, which may remove material in the silicide layer 120, may be a selective etch process in which the etchant has a higher selectivity for silicide than for silicon. A fourth etch process (e.g., a dry plasma etch process) may be used to etch silicon that forms the P+ layer 115, the N– layer 110, the N+ layer 105, and a portion of the P-type substrate 100.

Figure 4:
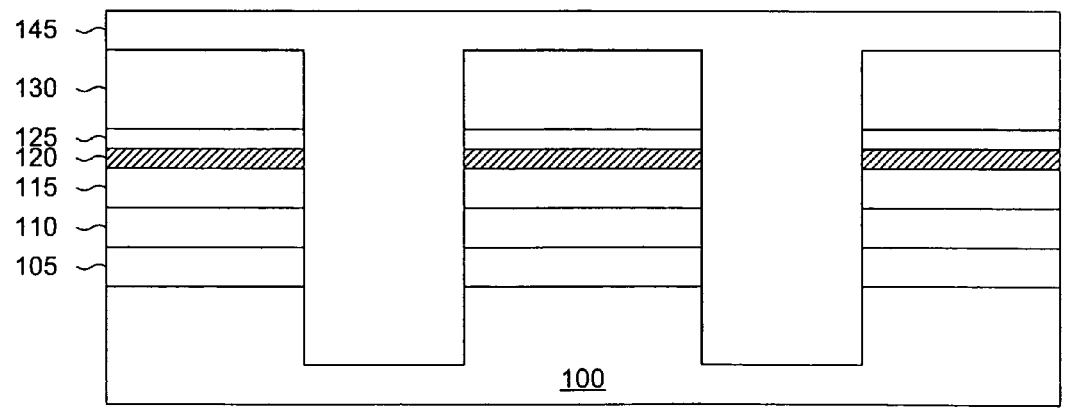
Figure 5:
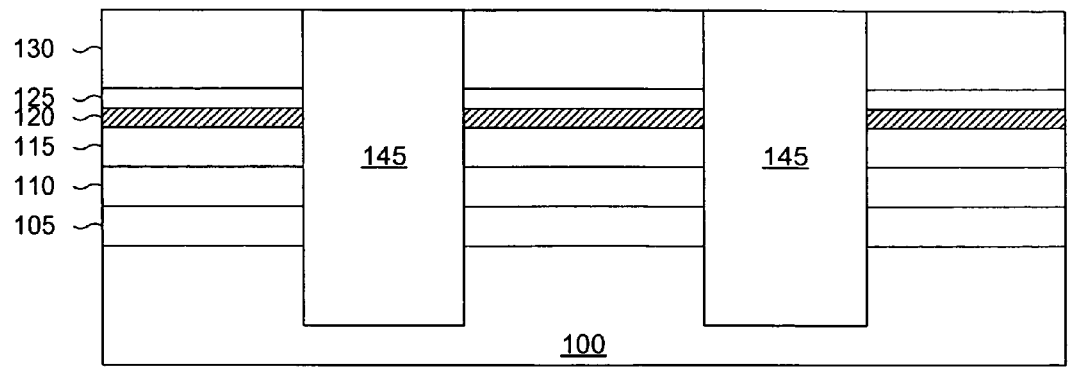

FIG. 4 is a cross-sectional diagram describing the result of depositing high-density plasma (HDP) oxide 145 on the structure illustrated in FIG. 3. The HDP oxide 145 fills the trenches 140 (FIG. 3) and overlies the silicon nitride layer 130. FIG. 5 is a cross-sectional diagram illustrating the result of performing chemical mechanical polishing (CMP) on the HDP oxide 145. The CMP operation nominally is terminated at an upper surface of the silicon nitride layer 130.

Figure 6:
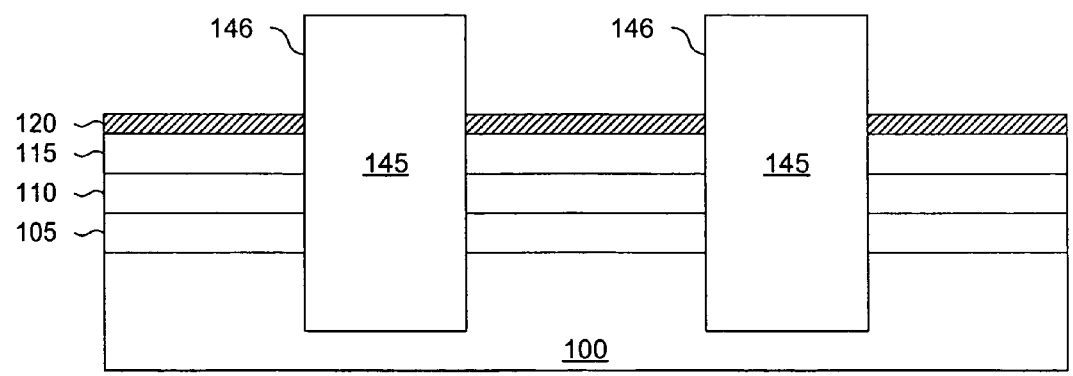

The cross-sectional diagram of FIG. 6 depicts the result of selectively removing the silicon nitride layer 130 and the buffer layer 125 from the structure illustrated in FIG. 5. The removing may include, for example, at least one or multiple etching processes performed in sequence. For example, a first etch process may be used to remove the silicon nitride layer 130 using an etchant having a higher selectivity for nitride than oxide, and a second etch process may be used to remove the buffer layer 125 in which the etchant has a higher selectivity for oxide than silicide. The effect of the removal is to form features 146 of HDP oxide material 145 that extend above the silicide layer 120.

Figure 7:
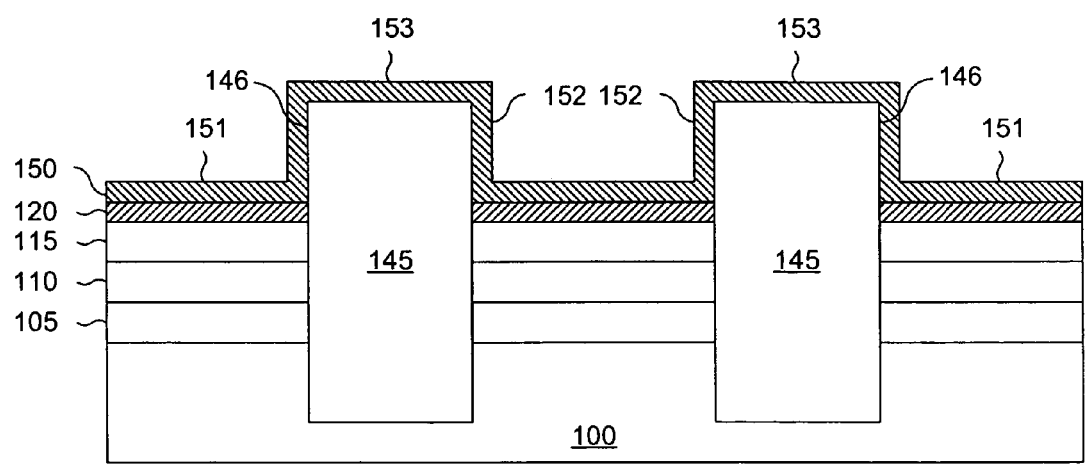

FIG. 7 is a cross-sectional diagram illustrating the result of depositing a film of conducting material 150 on exposed surfaces of the structure of FIG. 6. The conducting material 150 covers the silicide material 120, thereby forming a lower horizontal portion 151 of conducting material 150. The conducting material 150 also is deposited on side walls of the features 146 formed by the HDP oxide material 145, thereby forming a vertical portion of conducting material 150. An upper horizontal portion 153 of the conducting material 150 overlies the features 146 formed by the HDP oxide material 145. The vertical portion and the lower horizontal portion 151 of the conducting material 150 will be used in later steps of the method to form a bottom electrode 65 for the phase-change memory cell 55 as schematically illustrated in FIG. 1. The vertical portion of the conducting material 150 will henceforth be referred to as a bottom electrode 152. According to a typical embodiment, the conducting material 150 may comprise polysilicon, a metal such as W or Ta, or a metallic compound such as TiN, TiAlN, TiW, or TaN and may be deposited by a process such as chemical vapor deposition (CVD) or physical vapor deposition (PVD). The conducting material 150 can be deposited in typical embodiments to a thickness ranging from about 50 Å to about 500 Å, and in a preferred embodiment can be deposited to a thickness of about 100 Å.

Figure 8:
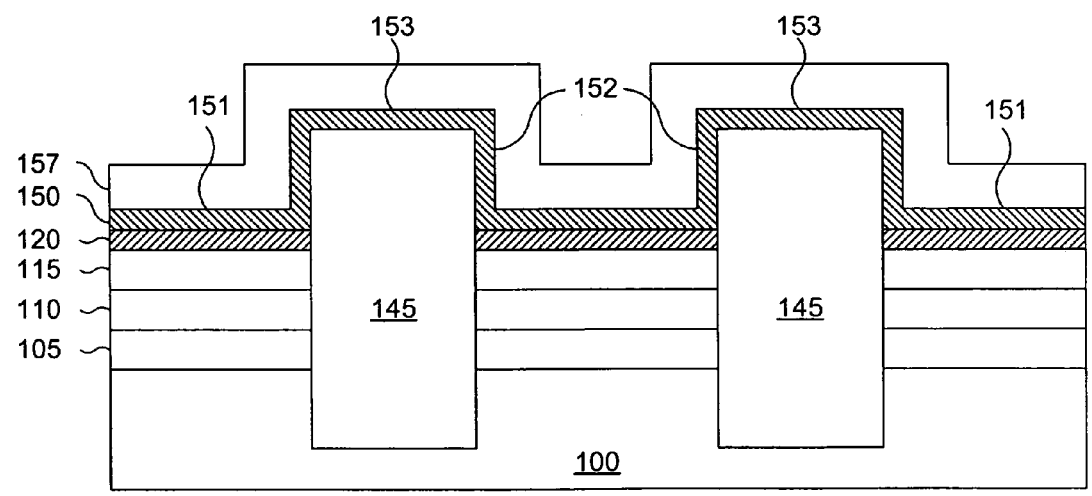
Figure 9:
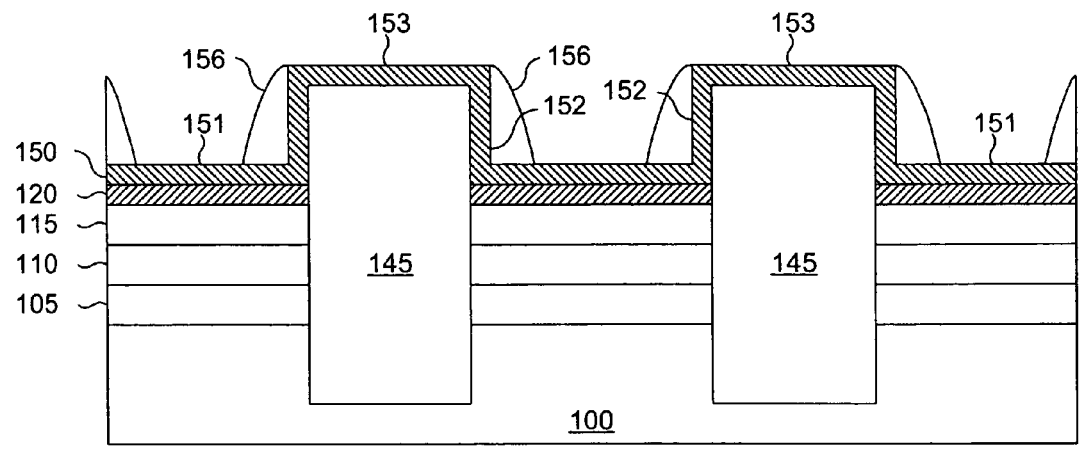

A cross-sectional diagram describing the result of disposing an oxide layer 157 on the conducting material 150 is shown in FIG. 8. The oxide layer 157 may comprise silicon dioxide according to an exemplary embodiment and typically is deposited using a CVD process. In accordance with the illustrated embodiment, the oxide layer 157 is applied uniformly over substantially all of the exposed surfaces of the structure to a thickness of about 100 Å to 3000 Å. Oxide spacers 156 (FIG. 9) can be formed by performing an anisotropic etch on the structure depicted in FIG. 8. The anisotropic etch is directed in a nominally vertical direction in order to remove horizontal portions of the oxide layer 157 (FIG. 8) while leaving residual oxide spacers 156, as shown in FIG. 9, that cover the bottom electrode 152 and part of the lower horizontal portions 151 of the conducting material 150. As presently embodied, all horizontally-disposed regions of the oxide layer 157 are etched by application of, for example, a reactive ion beam downwardly directed onto the substrate. The characteristics of pressure and power, for example, can be varied in the anisotropic etching process to accelerate ions vertically as opposed to at angles. The residual oxide spacers 156 of FIG. 9 have rounded or curved shapes in the illustrated embodiment and serve to narrow openings generally defined between features 146 of HDP oxide material 145.

Figure 10:
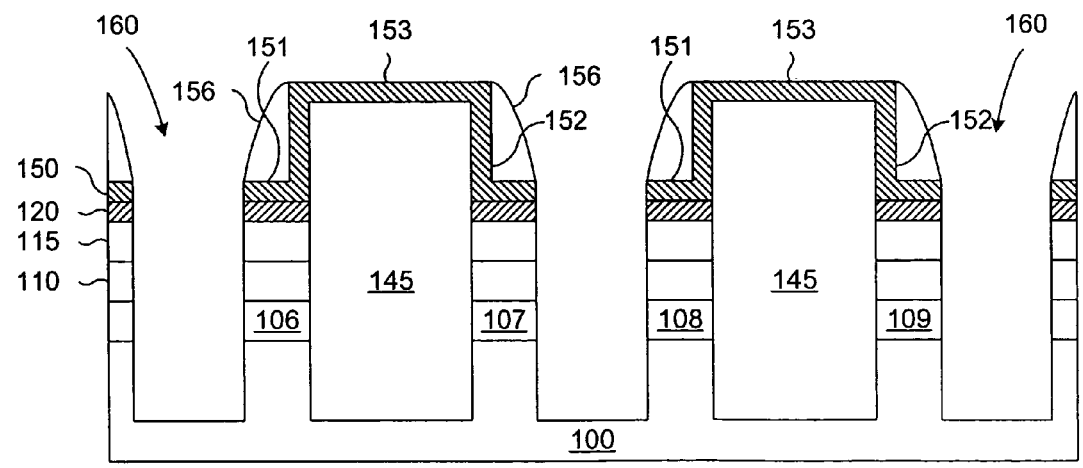

With reference to FIG. 10, trenches 160 are next formed in the structure of FIG. 9. The trenches 160 may be generated by using the oxide spacers 156 as hard masks and then etching according to the pattern of the oxide spacers 156. The etch operation may include, for example, multiple etching processes performed in sequence. For example, a first etch process may be a selective etch process in which the etchant has a higher selectivity for the conducting material 150 than far silicide and oxide, to thereby facilitate removal of exposed lower horizontal portions 151 of the conducting material 150 and define lower horizontal portion 151 sidewalls. A second etch process, which may remove material in the silicide layer 120, may be a selective etch process in which the etchant has a higher selectivity for silicide than for silicon and oxide. A third etch process may be used to etch silicon that forms the P+ layer 115, the N– layer 110, the N+ layer 105, and a portion of the P-type substrate 100, while continuing to use the patterned photoresist and oxide spacers 156 as masks.

The formation of the trenches 160 has the effect of establishing self-aligned bit lines 106–109 formed of the N+ layer 105. According to an exemplary embodiment, the bit lines 106–109 extend in a direction nominally orthogonal to, i.e., into, the plane of the diagram.

Figure 11:
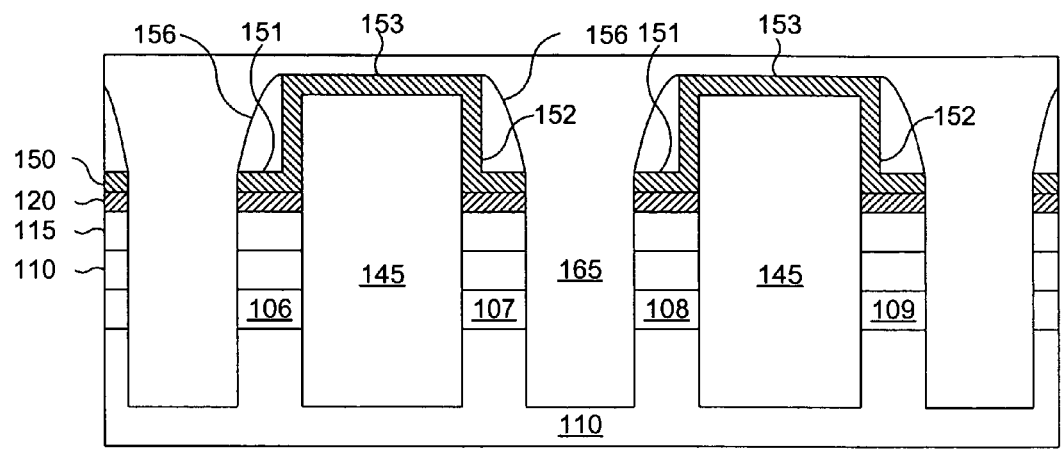
Figure 12:
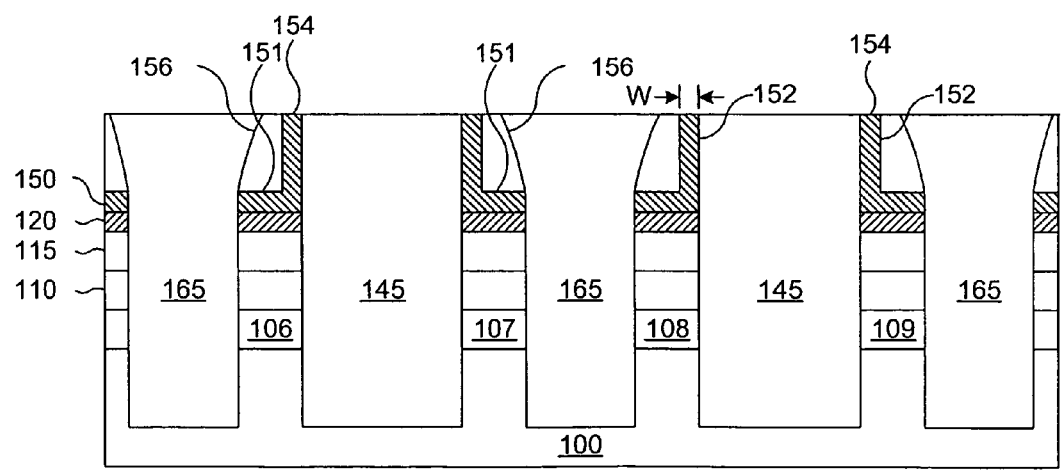

Turning to the cross-sectional diagram of FIG. 1, the structure of FIG. 10 is modified by forming an HDP oxide 165 over the oxide spacers 156 and the upper horizontal portions 153 of the conducting material 150. The HDP oxide 165 also extends into the trenches 160 (FIG. 10). FIG. 12 is a cross-sectional diagram depicting the result of performing a CMP operation on the structure illustrated in FIG. 11. The CMP operation removes a portion of the HDP oxide 165, a portion of the oxide spacers 156, and the upper horizontal portion 153 (FIG. 1) of the conducting material 150. Removing the upper horizontal portion 153 of the conducting material 150 exposes a surface 154 of the bottom electrode 152. The exposed surface 154 has a width (W) determined, not by parameters of a photolithographic process, but by a thickness of the layer of conducting material 150. The value of W may determine a first dimension of a contact with phase-change material 190 (FIG. 19) as described infra. As noted above with reference to FIG. 7, W, i.e. the thickness of the layer of conducting material 150, can range from about 50 Å to about 500 Å.

Figure 13:
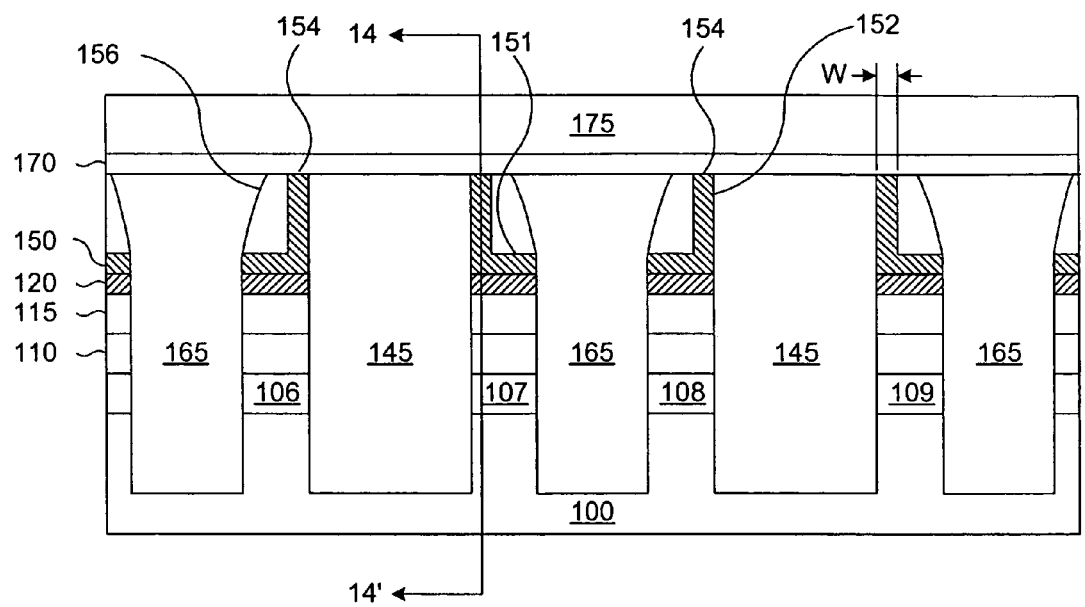

FIG. 13 is a cross-sectional diagram showing the result of depositing a layer of silicon dioxide 170 and a layer of silicon nitride 175 on the device of FIG. 12. According to exemplary embodiments, the silicon dioxide 170 may be deposited using a CVD process to a thickness ranging from about 100 Å to about 500 Å. In an illustrative embodiment, the thickness of the silicon dioxide layer may be about 300 Å. The silicon nitride material 175 overlies the silicon dioxide 170 in the illustrated embodiment. The silicon nitride material 175 may be deposited using a CVD process to a depth of about 1500 Å.

Figure 14:
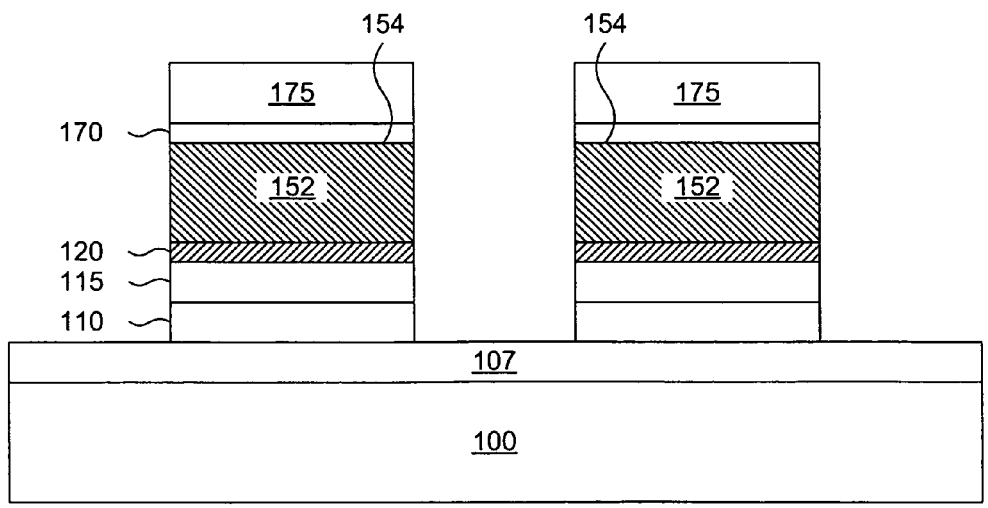

FIG. 14 is a cross-sectional diagram illustrating the result of patterning and etching the layers of the structure of FIG. 13 using known techniques to expose the bit line 107. The view depicted in FIG. 14 is taken along a line 14–14' shown in FIG. 13. The patterning and etching procedure may comprise performing multiple etching processes in sequence similar to those described above. The etching procedure forms stacks of layers that correspond to elements of a phase-change memory cell 55 as introduced schematically in FIG. 1 and as summarized in Table 1, infra.

Figure 15:
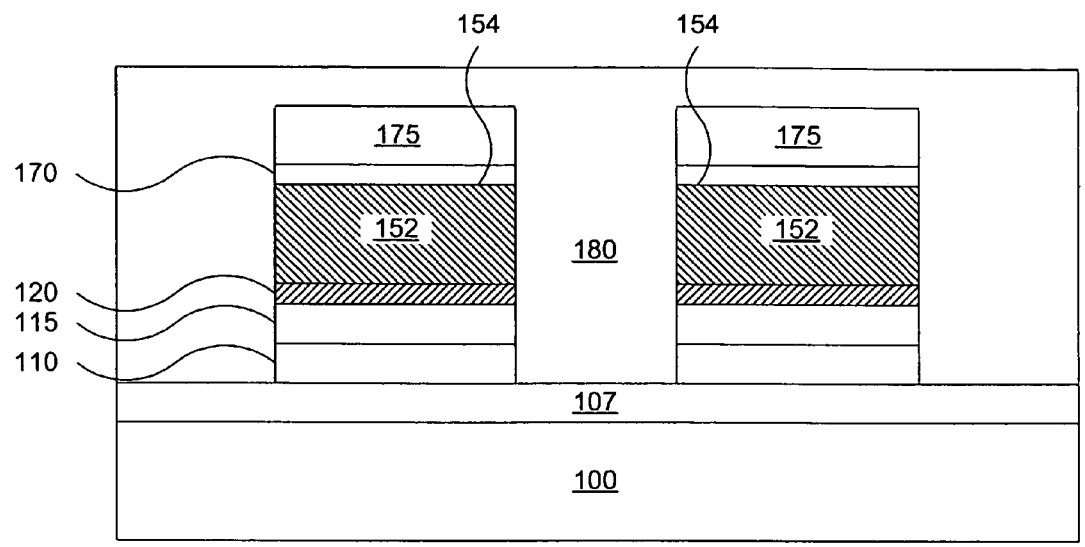
Figure 16:
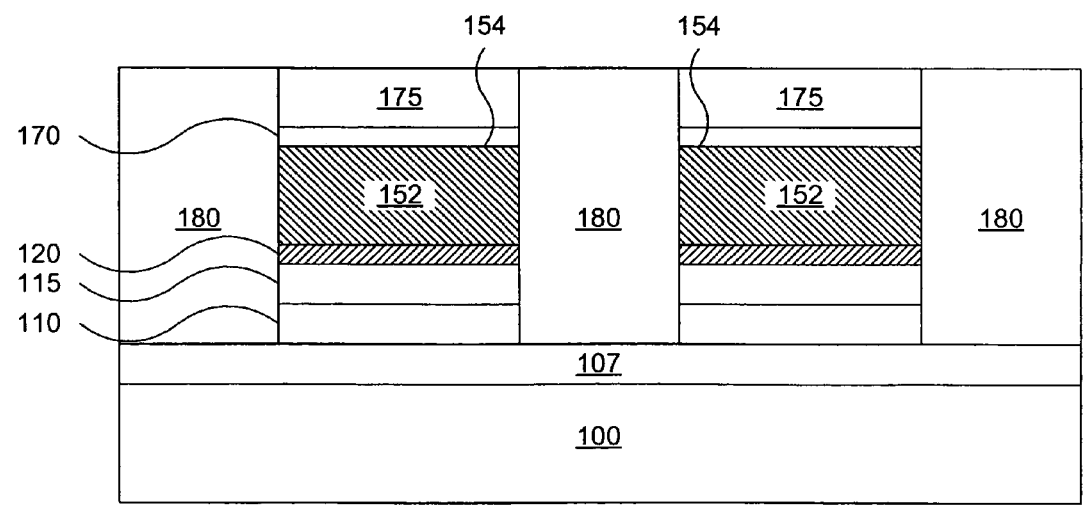

An HDP oxide 180 is then deposited over the structure illustrated in FIG. 14 to obtain the configuration shown in FIG. 15. The HDP oxide 180 provides isolation between the stacks of layers illustrated in FIG. 14. With reference to FIG. 16, a CMP step is then performed to remove excess HDP oxide 180 from upper surfaces of the layer of silicon nitride 175.

Figure 17:
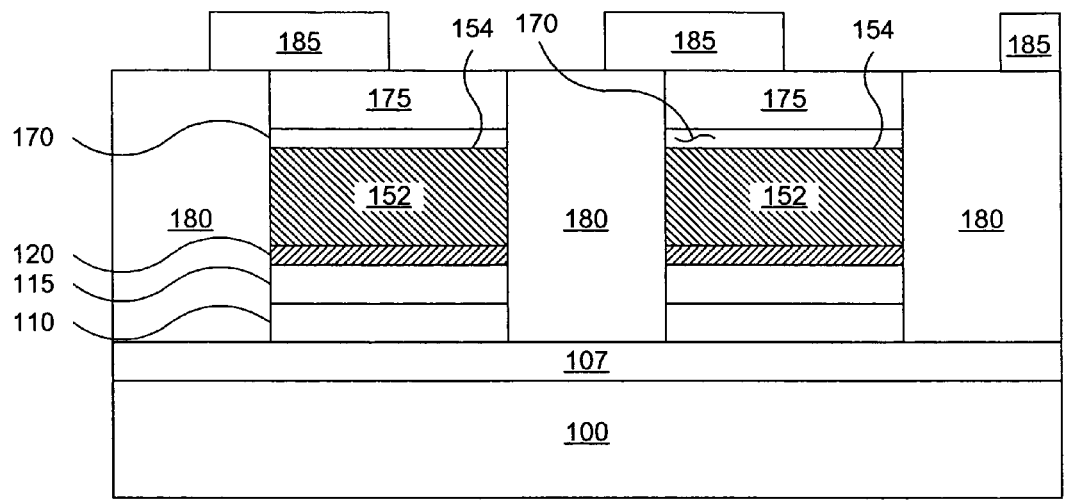

A layer of photoresist 185 then is applied to the surface of the structure of FIG. 16 and patterned as illustrated in FIG. 17. A reactive ion etch (RIE) process then may be performed, using the photoresist 185 as a mask, to remove a portion of the silicon nitride 175 and a portion of the HDP oxide 180. Removal of the portions of the silicon nitride 175 and the portion of the HDP oxide 180 results in a profile evident in FIG. 18 that exposes a portion of an edge 155 of the bottom electrode 152. The edge 155 defines a sidewall. The depth of the exposed portion of the edge 155 is D, a parameter controlled by the REI process used to remove the HDP oxide 180.

Figure 18:
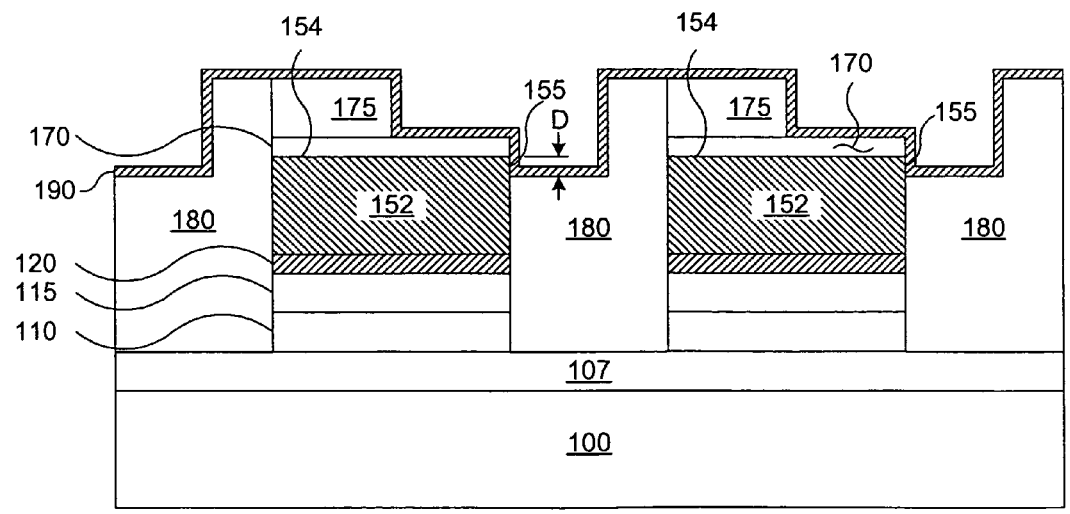
Figure 19:
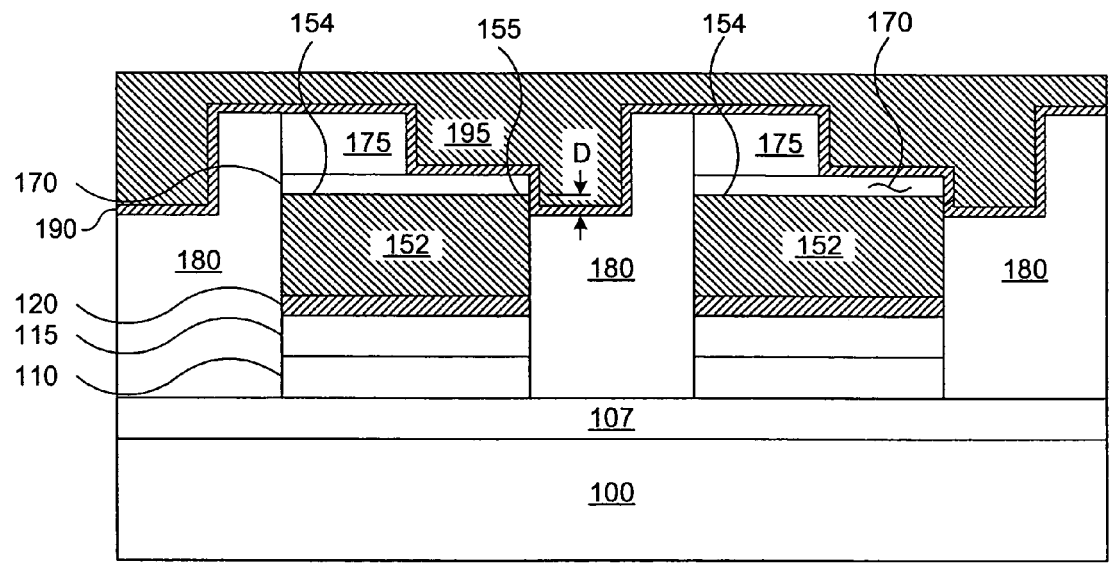

FIG. 19 illustrates a result of depositing a layer of phase-change material 190 on the profile of FIG. 18. The phase-change material 190, which may comprise a chalcogenide material, may be deposited using a PVD process to a nominal depth of about 500 Å. A metal layer 195 then is deposited on the layer of phase change material 190 as likewise illustrated in FIG. 19. CMP then can be used to remove a portion of the metal layer 195 to form word lines 196 and 197 oriented in a direction perpendicular to the plane of the diagram and to the direction of the bit line 107 as shown in FIG. 20.

It should be noted that the phase-change material 190 makes contact with the edge 155 of the bottom electrode 152 over a rectangular surface having dimensions of W, the thickness of the layer of conducting material 150 (FIG. 12), and D, the depth of the exposed portion of the edge 155. The contact surface therefore has a cross-sectional area of D×W. In typical embodiments, this cross-sectional area can be substantially smaller than $4F^2$, where F is a smallest dimension that can be provided by a semiconductor technology.

Figure 20:
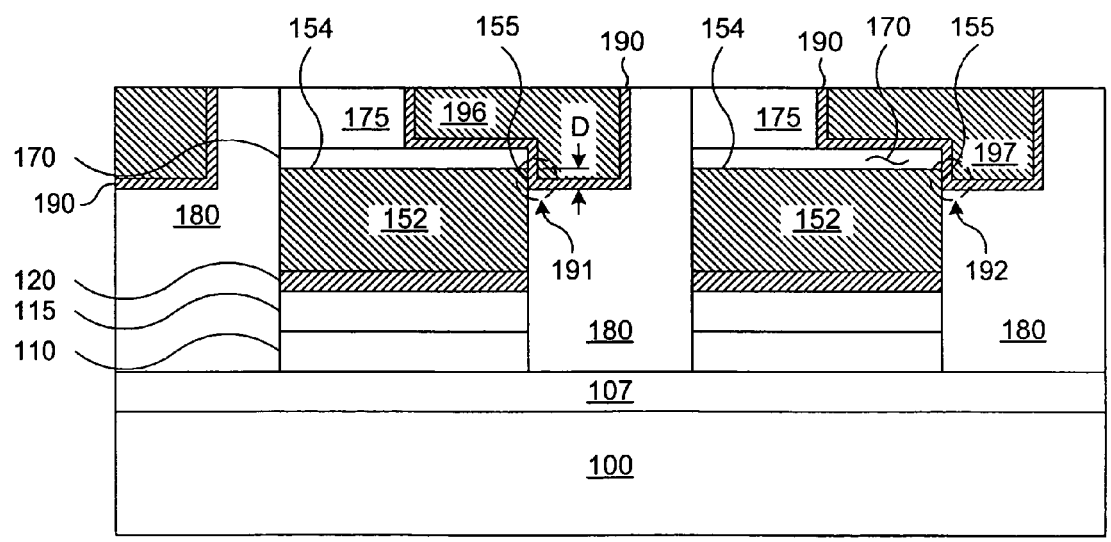

A combination of a bottom electrode 152, phase-change material 190 that makes contact with the bottom electrode 152, and a word line, e.g. word line 196, that makes contact with the phase-change material 190 can comprise a phase-change memory cell 191 when configured as indicated in FIG. 20. A similar memory phase-change memory cell 192 may be formed with phase-change material 190, a bottom electrode 152, and word line 197 as likewise illustrated in FIG. 20. Phase-change memory cells 191 and 192 may correspond to circuit elements illustrated in the array presented in FIG. 1. A correspondence between elements of the phase-change memory cell 191 and memory element 60 (FIG. 1) is summarized in Table 1.

TABLE 1

| FIG. 1 | FIG. 20 |
|---|---|
| Bit line 80 | Bit line 107 |
| Isolation device 70 | P+/N– layers 115/110 and silicide layer 120 |
| Bottom electrode 65 | Bottom electrode 152, |
| Phase-change memory element 60 | Phase-change memory cell 191 |
| Word line 90 | Word line 196 |

Specifically, with reference to FIGS. 1 and 20, bit line 80 may correspond to bit line 107. Isolation device 70 of phase-change memory cell 55 is formed in the illustrated embodiment by N– layer 110 and P+ layer 115. Salicide layer 120 provides electrical contact between the P+ layer 115 of the isolation device 70 and bottom electrode 65. The bottom electrode 65 corresponds to bottom electrode 152. The phase-change memory element 60 corresponds, for example, to phase-change material 190 disposed between bottom electrode 152 and the word line 196 in the neighborhood of edge 153. The word line 196 may correspond to word line 90.

Figure 21:
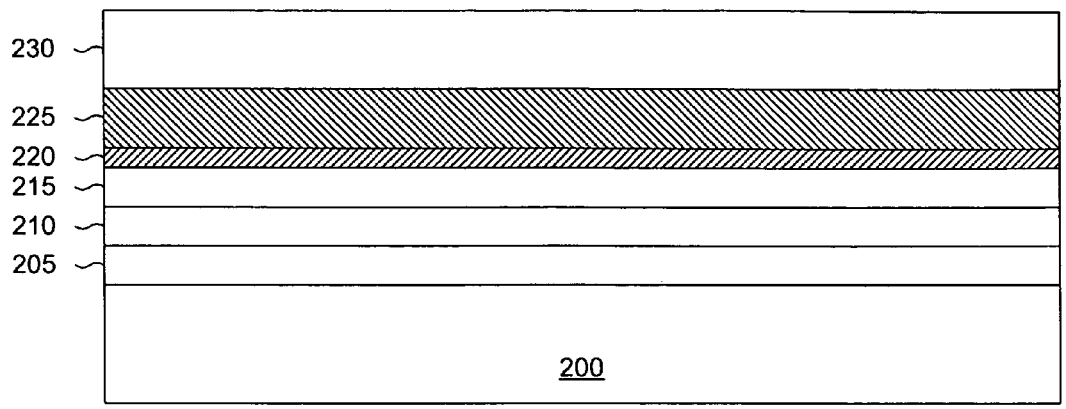
FIGS. 21–32 are cross-sectional diagrams illustrating results of processing steps of another implementation of the method of the present invention.
Figure 22:
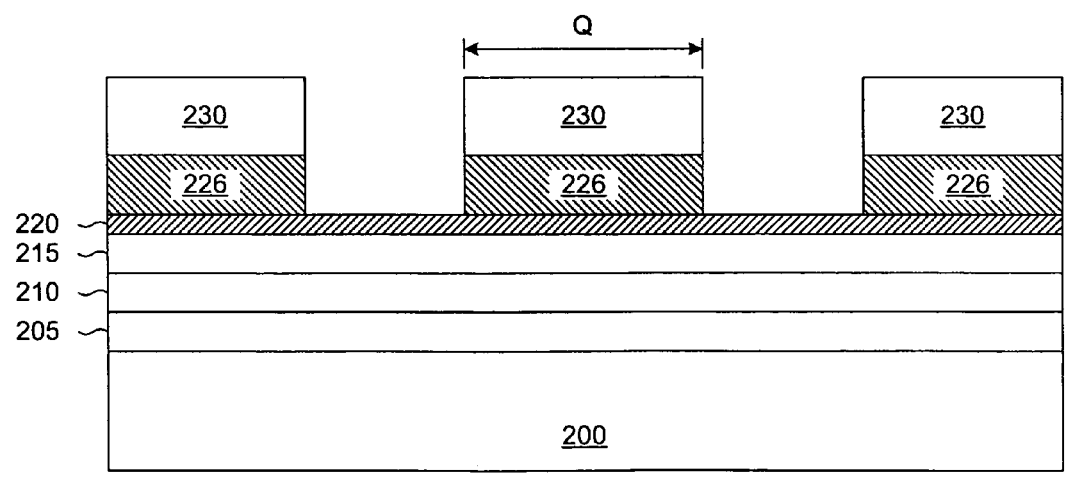
Figure 23:
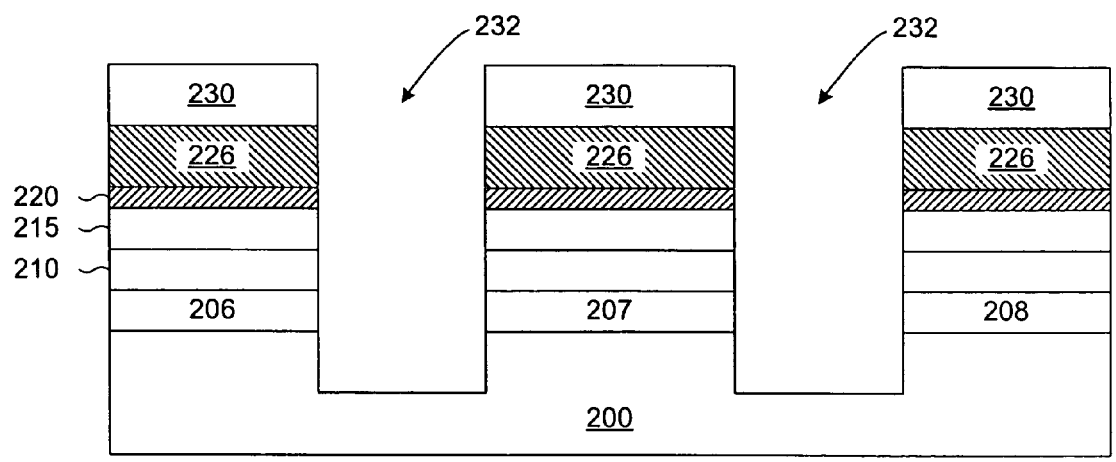

Other embodiments of phase-change memory cells can be fabricated using methods similar to that already described for the phase-change memory cells 191 and 192 illustrated in FIG. 20. Another example of phase-change memory cell construction begins as illustrated in FIG. 21. The structure shown in FIG. 21 comprises a P-type substrate 200, an N+ layer 205, an N– layer 210, a P+ layer 215, and a silicide layer 220, the respective layers being formed in a manner similar to that already described with reference to FIG. 2. A metal layer 225 comprising material similar to the conducting material 150 described with reference to FIG. 7 may be deposited on the suicide layer 220. A layer of silicon nitride 230 may be formed on the metal layer 225. The layer of silicon nitride 230 and the metal layer 225 then may be patterned, exposed, developed, and etched to form bottom electrodes 226 as illustrated in FIG. 22. At the stage of fabrication shown in FIG. 22, the bottom electrodes 226 extend into the plane of the diagram and have a width (Q). A multi-step etch process may then be performed to create trenches 232, shown in FIG. 23, defining bit lines 206–208 from the N+ layer 205. The trenches 232 then may be filled with HDP oxide 235, and CMP may be employed to planarize the result, the CMP stopping when the silicon nitride layer 230 is reached as depicted in FIG. 24.

Figure 24:
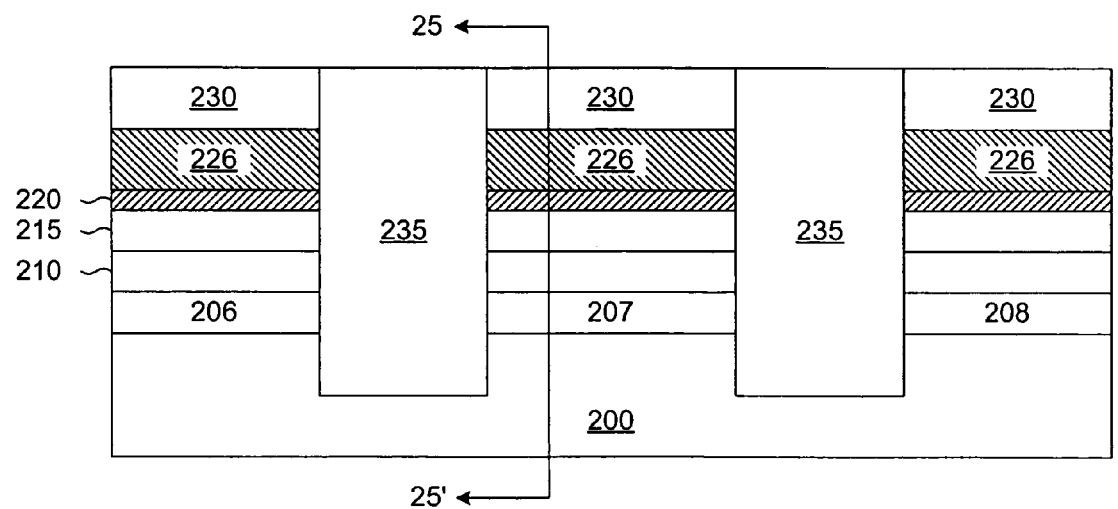
Figure 25:
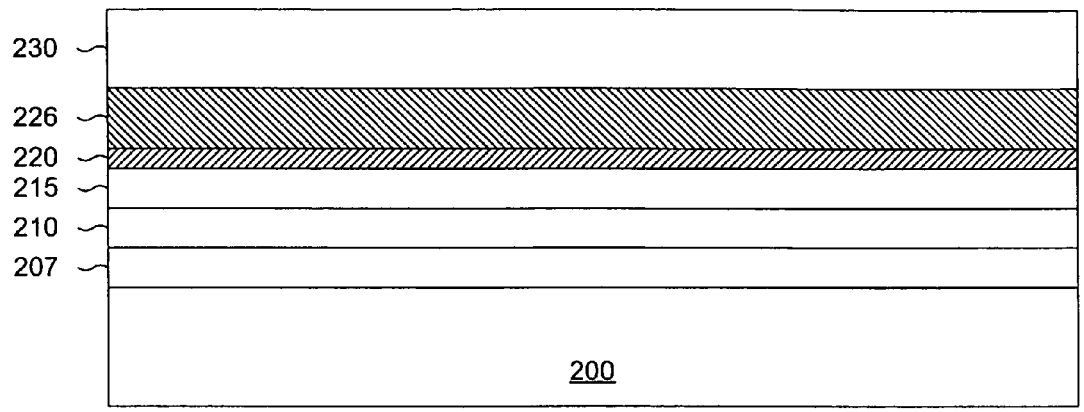
Figure 26:
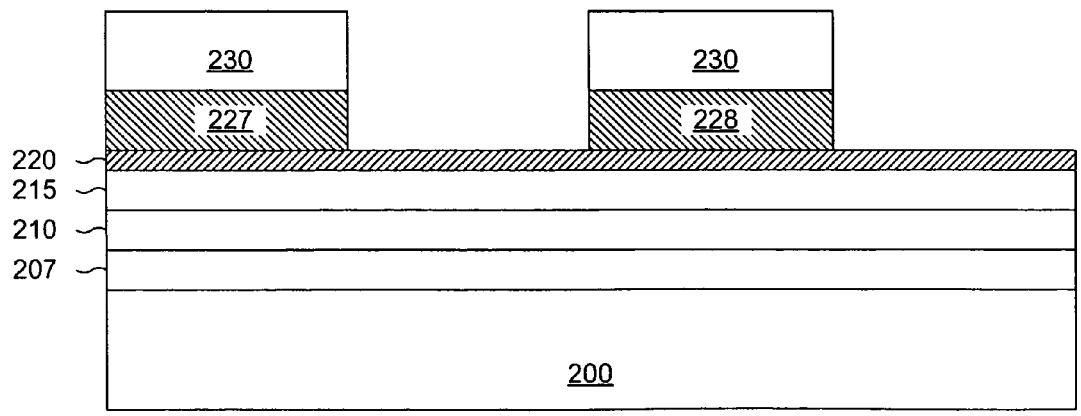
Figure 27:
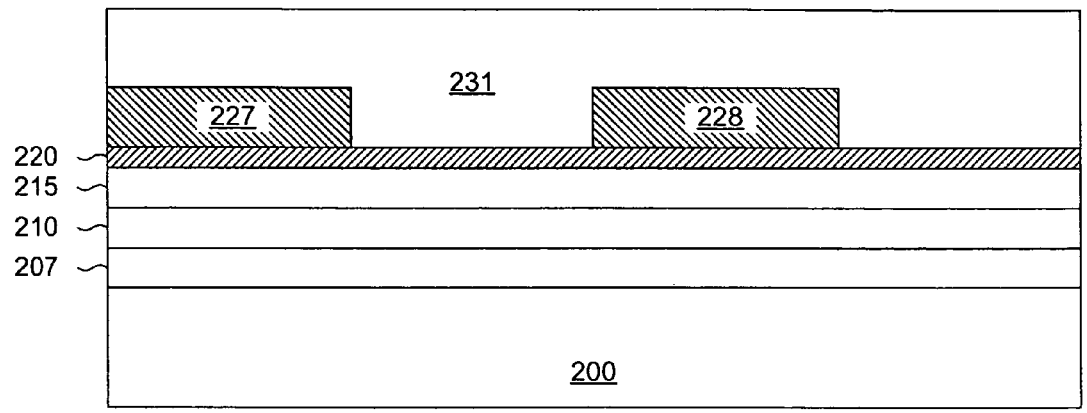
Figure 28:
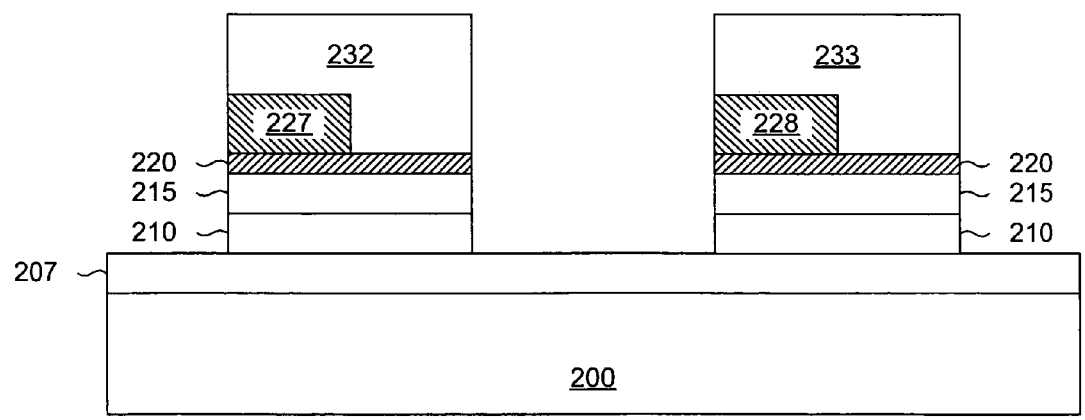
Figure 29:
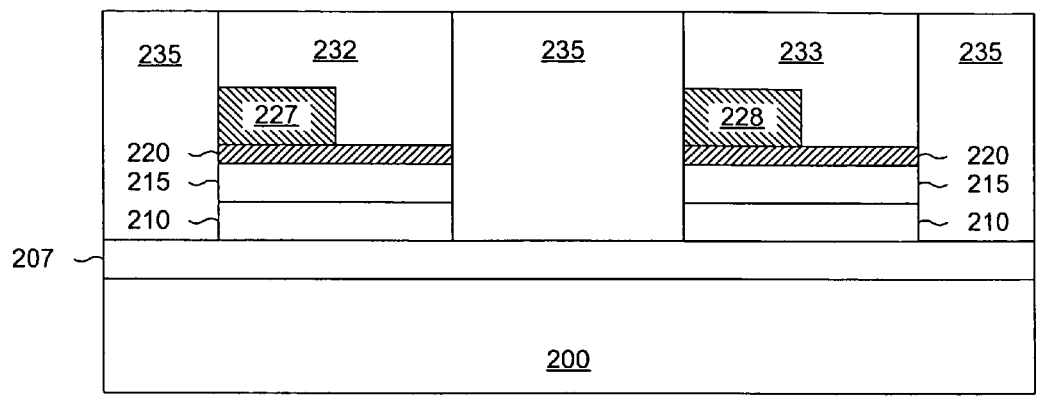
Figure 30:
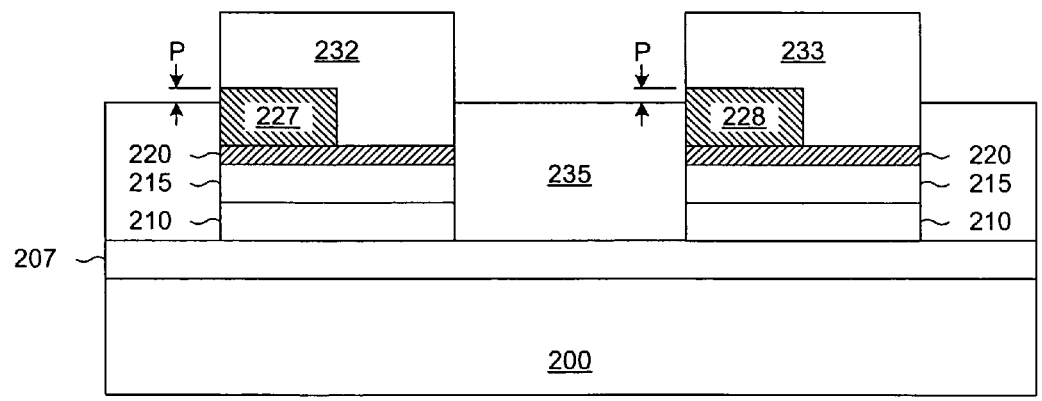
Figure 31:
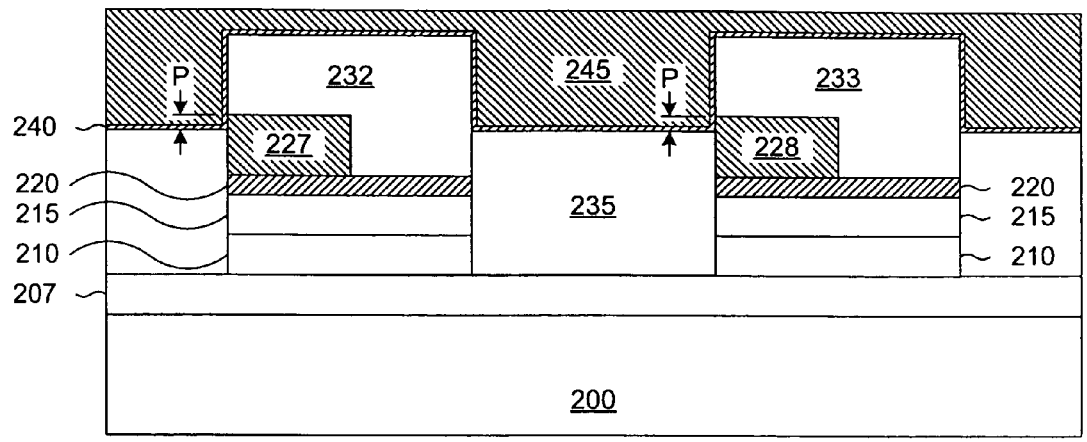

FIG. 25 is a cross-sectional view of the structure shown in FIG. 24, the view being taken along line 25–25' of FIG. 24. In the cross-section shown, the indicated layers correspond to similar layers shown in FIG. 21 except that N+ layer 205 has been formed into bit line 207 and metal layer 225 (FIG. 21) has been formed into bottom electrode 226. The structure of FIG. 25 may be etched to remove portions of the silicon nitride layer 230 and to form separate bottom electrodes 227 and 228 as illustrated in FIG. 26. Additional silicon nitride material then may be deposited over the structure of FIG. 26 yielding a composite silicon nitride layer 231 as shown in FIG. 27. Another multi-step etch process then may be employed to remove a portion of the silicon nitride layer 231, portions of the bottom electrodes 227 and 228, and portions of the silicide layer 220, the P+ layer 215, and the N− layer 210, exposing portions of the bit line 207 as depicted in FIG. 28. HDP oxide 235 then may be used to fill the removed portions as shown in FIG. 29, and the result again planarized with CMP, stopping on the silicon nitride layers 232 and 233. Another etch process then can be used to remove a portion of the HDP oxide layer 235 as shown in FIG. 30. The etch process may be controlled so that portions of bottom electrodes 227 and 228 are exposed to a depth (P). As illustrated in FIG. 31, a layer of phase-change material 240, which may be chalcogenide material, then may be formed on the structure. It should be noted that the phase-change material 240 makes contact with the bottom electrodes 227 and 228 over a rectangularly shaped surface having a width of Q (FIG. 22) and a depth of P. A contact surface is thereby formed between the bottom electrodes 227 and 228 and the phase-change material 240, the surface having an area of P×Q. Conducting material 245, which may comprise metal, then may be deposited on the layer of phase-change material 240, and CMP may be used to planarize the result leading to the memory cells illustrated in FIG. 32.

The value of Q in the embodiment just described is controlled by the photolithographic process used to begin formation of the bottom electrode 226 as shown in FIG. 22. The value of P is controlled by the etch process used to remove the HDP oxide 235. Therefore, the area, P×Q, may be very well controlled and may be smaller than $4F^2$ in practice.

Figure 32:
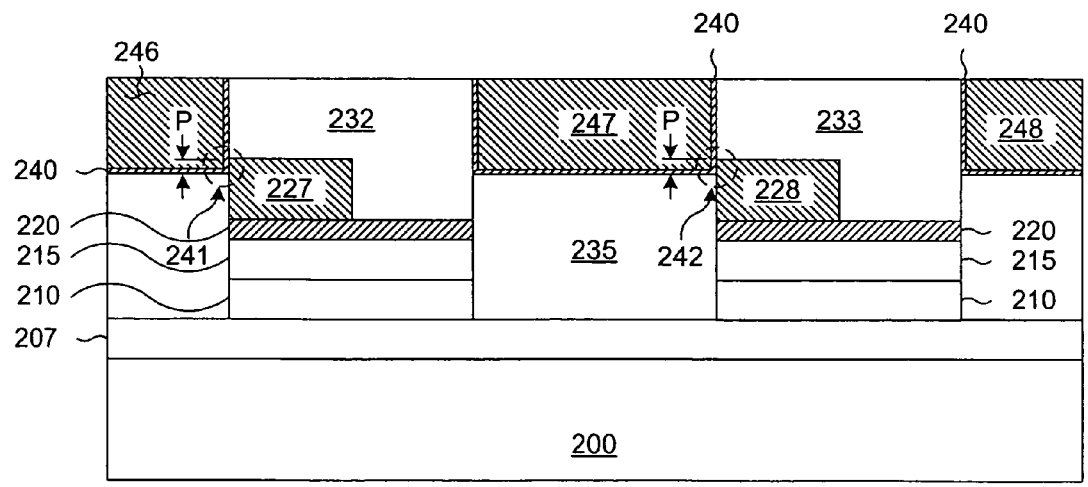

The combination of bottom electrode 227, phase-change material 240 making contact with bottom electrode 227, and word line 246 making contact with the phase-change material 240 comprises a phase-change memory cell 241 as pointed out in FIG. 32. Bottom electrode 228, phase-change material 240, and word line 247 likewise comprise a phase-change memory cell 242.

Phase-change memory elements corresponding, for example, to phase-change memory element 191 illustrated in FIG. 20 or to phase-change memory elements 241 and 242 illustrated in FIG. 32, may be operated by applying suitable voltages between word lines and bit lines. That is, a phase-change memory element corresponding to phase-change memory element 191 may be operated by applying suitable voltages between, e.g., bit line 107 and the word line 196. Similarly, a phase-change memory element that corresponds to phase-change memory element 192 may be operated by applying suitable voltages between bit line 107 word line 197. The relatively small areas of contact (D×W and P×Q in respective embodiments described herein) leads to dramatic decreases in the current and power required to operate phase-change memory cells when compared with conventional approaches.

Figure 33:
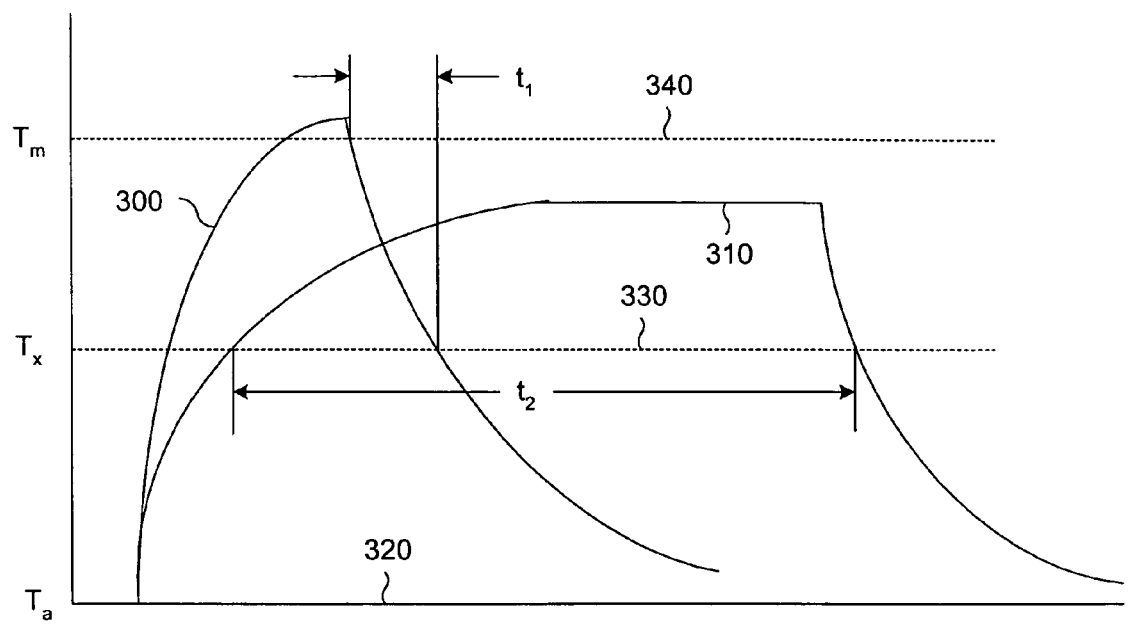
FIG. 33 is a graph of temperature waveforms associated with setting and resetting a chalcogenide memory cell.

FIG. 33 is a graph of temperature waveforms associated with setting and resetting a phase-change memory cell. The graph portrays temperature on a vertical axis with time on a horizontal axis. A phase-change memory cell may be reset, that is, the phase-change memory cell may be placed into an amorphous state, by applying a amorphizing pulse of current that changes the temperature of a phase-change memory element within the phase-change memory cell according to the amorphizing reset waveform 300. The amorphizing reset waveform 300 causes the temperature of the phase-change memory element to rise from an ambient temperature $T_a$ 320 above a maximum temperature $T_m$ 240 and then to remain above an intermediate temperature $T_x$ 330 for an amount of time $t_1$. With reference to FIG. 20, the phase-change memory element that corresponds to phase-change memory element 191 may be placed into an amorphous state by applying an amorphizing pulse between bit line 107 and word line 196.

A phase-change memory cell may be set, that is the phase-change memory cell may be placed into a crystaline state by applying a crystalizing pulse of current that changes the temperature of the phase-change memory element according to the crystalizing waveform 310. The crystalizing set waveform 310 causes the temperature of the phase-change memory element to rise from the ambient temperature $T_a$ 320 above the intermediate temperature $T_x$ 330 but below the maximum temperature $T_m$ 340 for an amount of time $t_2$. With reference again to FIG. 20, the phase-change memory element that corresponds to phase-change memory element 191 may be placed into a crystalline state by applying a crystalizing pulse between bit line 107 and word line 196. Typical values for $T_a$ 320, $T_x$ 330, and $T_m$ 340 are room temperature, 150° C., and 630° C., respectively. Time interval $t_1$ may range from about 0.1 ns ns to about 20 ns ns, 0.1 ns to 20 ns and $t_2$ may range from about 60 ns to about 1000 ns.

In view of the foregoing, it will be understood by those skilled in the art that the methods of the present invention can facilitate formation of phase-change memory devices in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of forming a memory cell, comprising:
   forming a bottom electrode above a substrate, the bottom electrode having a first height;
   covering the bottom electrode with an insulating material;
   removing a portion of the insulating material to expose a portion of a side-wall of the bottom electrode, wherein the exposed portion of the side-wall having a second height, and wherein the second height is shorter than the first height; and
   forming a layer of phase-change material, thereby forming a direct physical and electrical contact between the layer of phase-change material and the exposed portion of the side-wall of the bottom electrode.

2. The method as set forth in claim 1, wherein the forming of a layer of phase-change material comprises disposing a chalcogenide material.

3. A semiconductor element produced by the method of claim 2.

4. The method as set forth in claim 2, wherein the forming of a bottom electrode comprises depositing a film of conducting material having a thickness substantially equal to the first height.

5. The method as set forth in claim 4, wherein the depositing comprises depositing a film of conducting material having a lower horizontal portion, a vertical portion, and an upper horizontal portion.

6. The method as set forth in claim 5, wherein the removing of part of the bottom electrode comprises removing part of the lower horizontal portion.

7. The method as set forth in claim 6, wherein the removing of a portion of the insulating material comprises performing an etch process.

8. A semiconductor element produced by the method of claim 7.

9. The method as set forth in claim 2, further comprising:
providing a self-aligned bit line in the substrate;
forming an isolation device on the bit line; and
forming a silicide on the isolation device, the silicide contacting the bottom electrode.

10. The method as set forth in claim 9, wherein the forming of an isolation device comprises forming a PN diode.

11. The method as set forth in claim 10, further comprising:
depositing conducting material on the layer of phase-change material; and
removing a portion of the conducting material to form a self-aligned word line.

12. The method as set forth in claim 2, wherein the forming of a bottom electrode comprises:
depositing a film of conducting material; and
removing a portion of the conducting material.

13. The method as set forth in claim 12, wherein the removing of a portion of conducting material comprises:
depositing photoresist on the film of conducting material;
removing a portion of the photoresist according to a pattern;
etching the film of conducting material using remaining photoresist as a mask; and
removing the remaining photoresist.

14. A semiconductor element produced by the method of claim 13.

* * * * *